US009735747B2

(12) United States Patent
Rider et al.

(10) Patent No.: US 9,735,747 B2
(45) Date of Patent: Aug. 15, 2017

(54) BALANCING MOBILE DEVICE AUDIO

(71) Applicant: Intel Corporation, Santa Clara, CA (US)

(72) Inventors: Tomer Rider, Naahryia (IL); Shahar Taite, Kfar Saba (IL); Igor Ljubuncic, London (GB); Raphael Sack, Mitzpe Amuka (IL)

(73) Assignee: Intel Corporation, Santa Clara, CA (US)

( * ) Notice: Subject to any disclaimer, the term of this patent is extended or adjusted under 35 U.S.C. 154(b) by 83 days.

(21) Appl. No.: 14/796,667

(22) Filed: Jul. 10, 2015

(65) Prior Publication Data

US 2017/0012591 A1    Jan. 12, 2017

(51) Int. Cl.
| | | |
|---|---|---|
| *H03G 3/20* | (2006.01) | |
| *H03G 3/30* | (2006.01) | |
| *H04R 3/00* | (2006.01) | |
| *H04R 29/00* | (2006.01) | |
| *H04R 1/02* | (2006.01) | |

(52) U.S. Cl.
CPC ............ *H03G 3/3005* (2013.01); *H04R 3/00* (2013.01); *H04R 29/001* (2013.01); *H04R 1/028* (2013.01); *H04R 2201/023* (2013.01); *H04R 2420/03* (2013.01); *H04R 2430/01* (2013.01); *H04R 2499/11* (2013.01); *H04R 2499/15* (2013.01)

(58) Field of Classification Search
CPC ...................................................... H03G 3/32
See application file for complete search history.

(56) References Cited

U.S. PATENT DOCUMENTS

| | | | |
|---|---|---|---|
| 2013/0057489 A1 | 3/2013 | Morton et al. | |
| 2014/0044286 A1* | 2/2014 | Coles | G06F 1/1688 |
| | | | 381/150 |
| 2014/0085445 A1 | 3/2014 | Joao | |
| 2014/0128131 A1 | 5/2014 | Sin | |
| 2014/0369512 A1* | 12/2014 | Slupeiks | H04R 3/00 |
| | | | 381/59 |

FOREIGN PATENT DOCUMENTS

| | | | |
|---|---|---|---|
| EP | 2429155 A1 * | 3/2012 | |
| JP | 2010096609 A * | 4/2010 | |
| KR | 10-1337420 | 12/2013 | |
| KR | 10-20140057462 | 5/2014 | |

OTHER PUBLICATIONS

International Search Report and Written Opinion for PCT Application No. PCT/US2016/036215, mailed on Oct. 12, 2016.

* cited by examiner

*Primary Examiner* — Regina N Holder
(74) *Attorney, Agent, or Firm* — Green, Howard & Mughal LLP.

(57) ABSTRACT

Techniques related to balancing audio for mobile devices are discussed. Such techniques may include detecting a speaker of the device is at least partially obstructed, determining an audio output from the device is impeded due to the speaker being at least partially obstructed, and increasing an output from the speaker and/or an alternative speaker based on the audio output from the device being impeded.

25 Claims, 6 Drawing Sheets

BALANCING MOBILE DEVICE AUDIO

BACKGROUND

In mobile device contexts, a challenge arises in providing consistent, high quality audio from speakers of the mobile device due to users changing the position they are using to hold the device as well as the position and orientation of the device. For example, hands, fingers, clothing, or the like may partially or completely obstruct the speakers of the mobile device, which may cause audio distortions such as reduced volume, distorted pitch, or the like. Such problems may exist for all users and may be particularly prevalent among the elderly and children, who may not be familiar with holding and orienting such devices such that such audio problems may be reduced or eliminated.

Furthermore, such problems may become increasingly frequent as mobile devices and/or wearable devices become more common and such problems may become critical as users demand high quality audio in mobile and/or wearable devices.

It may be desirable to provide high quality audio from mobile devices even in contexts where speakers may be partially or fully obstructed. It is with respect to these and other considerations that the present improvements have been needed. Such improvements may become critical as the desire to provide high quality audio from mobile devices becomes more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as audio devices, multi-function devices, tablets, smart phones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, firmware, software, or any combination thereof. The material disclosed herein may also be implemented as instructions stored on a machine-readable medium, which may be read and executed by one or more processors. A machine-readable medium may include any medium and/or mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

Methods, devices, apparatuses, computing platforms, systems, and articles are described herein related to performing audio balancing for devices such as mobile or wearable devices.

As described above, in some contexts such as mobile device or wearable device contexts, hands, fingers, clothing, or the like of the user of the device may partially or completely obstruct one or more speakers of the device. In some examples, obstructing the one or more speakers may cause audio output from the device to be impeded (e.g., distorted and/or reduced in volume or the like). In some embodiments discussed herein, performing audio balancing for a device such as a mobile device or a wearable device or the like may include detecting a speaker of the device is at least partially obstructed. Such a detection may be performed using any suitable sensor and/or technique such as detection of physical pressure, detection of a change in infrared light, detection of a change in temperature, detection of a change in electrical resistance, detection of a change in electrical conductivity, detection of a change in the shape of a case of the device, or the like. In some embodiments, the detection may include obtaining an audio sample from the speaker and determining the audio sample is distorted.

In response to such a detection of an obstructed or partially obstructed speaker, a determination may be made as to whether an audio output from the device is being impeded due to the obstructed or partially obstructed speaker. Such a determination may be made based on determining whether an audio sample from the device is distorted and/or reduced in volume or the like. If the audio output is not impeded, no change in audio output from the device may be needed. If the audio output is impeded, an output from the speaker (e.g., the speaker that is obstructed or partially obstructed) may be increased and/or an output from another speaker may be increased to compensate for the impeded audio output from the device. In some examples, the output from the speaker may be increased to overcome the obstruction. In some examples, another speaker or speakers may be determined to provide audio balancing such that output from the obstructed speaker may be reduced and output from the other speaker or speakers may be increased. For example, the other speaker or speakers may be proximate to the obstructed or partially obstructed speaker. In some examples, audio samples from the device may be obtained and tested and such audio balancing may repeated to further increase the quality of audio output from the device.

Such techniques may provide audio balancing and/or the elimination or prevention of audio distortions in mobile devices or wearable devices or the like. For example, physical obstructions of speakers in mobile devices or wearable devices or the like may be detected and audio output may be redirected to other speakers and/or increased at the obstructed speaker to provide consistent and high quality audio output. Such techniques may provide for excellent user experience and higher sound quality from the device.

Figure 1:
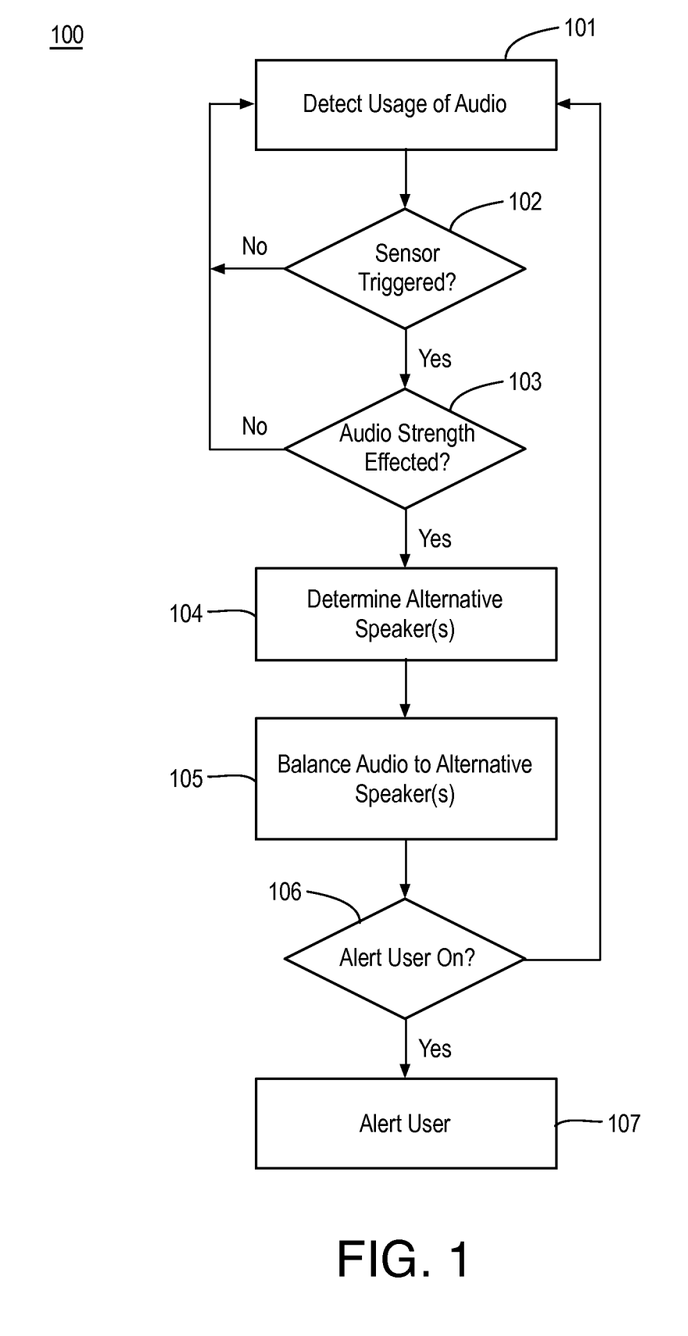
FIG. 1 illustrates an example process for performing audio balancing for a device.

FIG. 1 illustrates an example process 100 for performing audio balancing for a device, arranged in accordance with at least some implementations of the present disclosure. Process 100 may include one or more operations 101-107 as illustrated in FIG. 1. Process 100 may be performed by a device (e.g., device 200 or any other devices or systems discussed herein) or portions of process 100 may be performed by a device or system to perform audio balancing. Process 100 or portions thereof may be repeated or performed substantially continuously during any audio operations of a device.

As shown, process 100 may begin at operation 101, "Detect Usage of Audio", where audio usage via a device may be detected. Audio usage may be detected using any suitable technique or techniques such as via device application protocol interfaces, system interfaces, audio application interfaces, or the like. In some examples, operation 101 may include detecting audio usage such that the audio is being provided via at least one speaker of a device such as a mobile device or a wearable device or the like.

Figure 2:
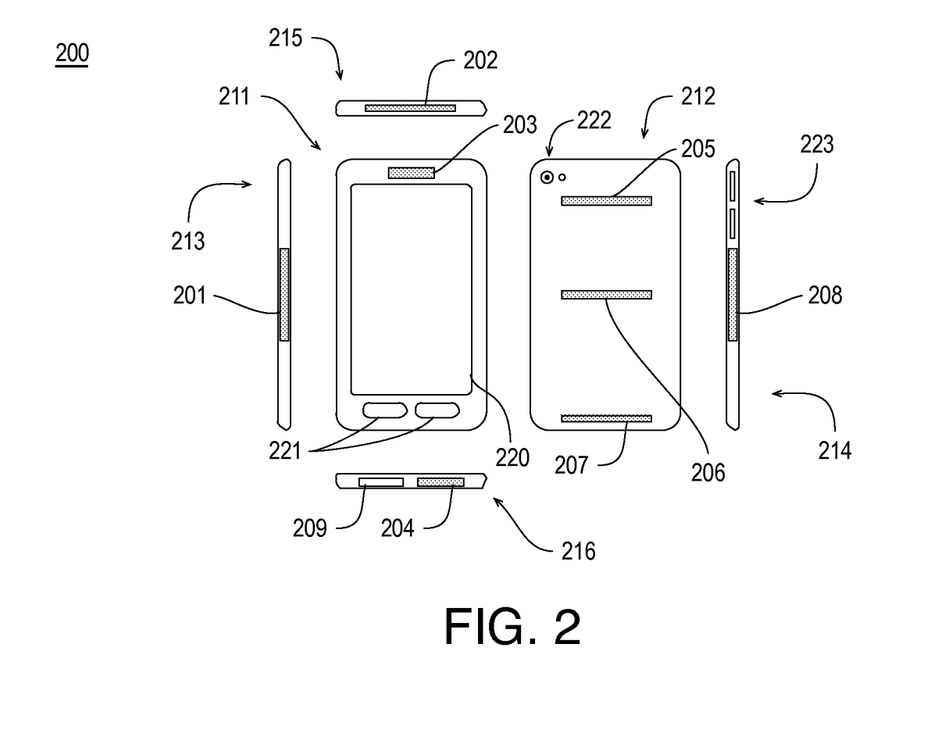
FIG. 2 illustrates an example device for performing audio balancing.

FIG. 2 illustrates an example device 200 for performing audio balancing, arranged in accordance with at least some implementations of the present disclosure. As shown, device 200 may include one or more speakers 201-208, a display 220, a camera 222, navigation buttons 221, a microphone 209, and buttons 223. In the illustrated example, device 200 is a smart phone. However, device 200 may include any suitable device such as a mobile device having any suitable form factor such as a laptop computer, a tablet, a smart phone, a phablet, a digital camera, a gaming console, a wearable device such as a smart watch or smart glasses, or the like. Device 200 may also include sensors (discussed further herein with respect to FIG. 3), which are not illustrated in FIG. 2 for the sake of clarity of presentation.

In the illustrated example, device 200 includes speaker 203 on a front 211, speaker 201 on a left side 213, speaker 208 on a right side, speaker 202 on a top 215, speaker 204 on a bottom 216, and speakers 205, 206, 207 on a back 212 of device 200. However, device 200 may include any number of speakers in any orientation and on any surfaces of device 200. In some embodiments, device 200 may include speaker 203 for use during phone operations and one or more additional speakers (e.g., speakers 201, 202, 204-208 or the like) for use during audio operations. In some embodiments, such additional speakers may be on back 212, on one or both of sides 213, 204, or on one or both of top 215 or bottom 216 of device 200. For example, device 200 may include one or more speakers 201-208 that may have varying positions with respect to device 200 depending on the form factor of device 200, the usage of device 200, the placement of microphone 209, or the like. In some embodiments, device 200 may include multiple speakers 201-208, which may provide for more accurate and flexible adjustment, redirection, or traveling of audio output via device 200. In an embodiment, device 200 may include two speakers such that an obstruction of one speaker may be identified and audio output may be diverted to the other speaker in response to the obstruction. In an embodiment, device 200 may include one speaker such that an obstruction of the speaker may be identified and audio output may be increased to the speaker in response to the obstruction.

As discussed, in some examples, a user may hold or grip device 200 in a manner that partially or fully obstructs one or more of speakers 201-208. For example, a user may hold device 200 with a right hand in such a manner such that speaker 208 may be obstructed by a thumb of the user and/or such that one or more of speakers 205-207 are obstructed by a palm of the user or the like. In other examples, clothes of the user, a mounting device, or the like may obstruct a speaker of device 200. Furthermore, wearable devices may require different geometries and device shapes, which may cause speakers being obstructed by clothing, jewelry, skin, hand held bags, or the like that may impede audio quality. Also, as is discussed further herein, in response to such partial or complete obstructions of one or more speakers, sound may be diverted to other speakers and/or such other speakers may be activated (e.g., turned on) in response to such a detected obstruction. For example, such sound diversion and/or speaker activation may be based on the position, orientation, and/or incidence of device 200.

Returning to FIG. 1, processing may continue at decision operation 102, "Sensor Triggered?", where a determination may be made as to whether a sensor associated with a speaker or speakers (e.g., to detect partial or full obstruction of the speaker or speakers) has been triggered. Such a sensor or sensors may be implemented using any suitable technique or techniques and such a sensor or sensors may be used to detect any suitable factor that may indicate obstruction of the associated speaker or speakers. For example, detecting a sensor has been triggered may provide detection that a speaker of a device such as device 200 is at least partially obstructed (e.g., covered) based on an external physical obstruction such as a hand, clothing, jewelry, or the like.

Figure 3:
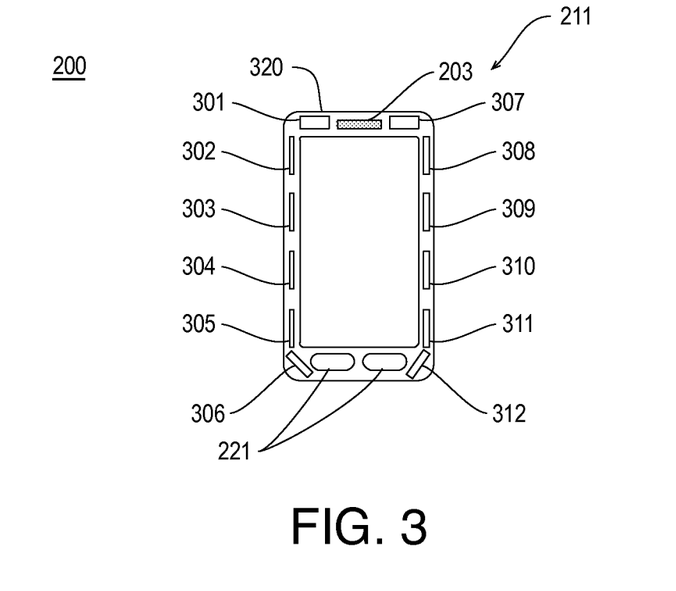
FIG. 3 illustrates example sensors of the example device.

FIG. 3 illustrates example sensors of example device 200, arranged in accordance with at least some implementations of the present disclosure. As shown in FIG. 3, device 200 may include one or more sensors 301-312. FIG. 3 illustrates sensors 301-312 implemented on front 211 of device 200. However, sensors 302-313 may be implemented on front 211, left side 213, right side 214, bottom 216, top 215, and/or back 212 as needed. Also, as discussed, sensors 301-312 may be associated with one or more speakers of device 200. In some examples, one or more sensors 301-312 may be associated with or assigned to monitor obstructions for a particular speaker. For example, sensor 301 and/or sensor 307 may be associated with speaker 203, sensor 309 and/or sensors 308, 309 may be associated with speaker 208 (please refer to FIG. 2), sensor 303 and/or sensors 302, 305 may be associated with speaker 201 (please refer to FIG. 2), and so on. Furthermore, device 200 may include additional speakers (e.g., at additional locations on front 211) associated with some or all of sensors 301-312.

Sensors 301-312 may include any suitable sensors and/or combinations thereof to detect any suitable factor that may indicate obstruction of the associated speaker or speakers. For example, sensors 301-312 and/or related circuitry may detect a particular condition or a change in such a condition and provide the condition, the change in condition, a trigger signal, or the like or such parameters may be monitored by a controller and, based on such parameters, a determination may be made that one or more sensors have been triggered indicating an associated speaker or speakers may be obstructed or partially obstructed.

As discussed, sensors 301-312 may include any suitable sensors and/or combinations thereof. In some embodiments, sensors 301-312 may include one or more physical pressure sensors that may detect or be triggered by physical pressure (e.g., by the hand of a user or the like). For example, the physical pressure sensors may include air pressure membranes or the like. In some examples, a casing 320 of device 200 may include multiple segmented pieces such that sensors 301-312 may be implemented as buttons via the segmented pieces or the like. For example, sensors 301-312 may provide indications of pressure being provided by a user holding device 200 (e.g., via an air pressure membrane, button or the like). As discussed, such pressure sensors or buttons may be implemented in any suitable location or locations around device 200 such as left side 213, right side 214, front 211, back 212, top 215, and/or bottom 216 of device 200. As is discussed further herein, when such pressure sensors or buttons are pressed, a nearby speaker or speakers may be deactivated and/or sound may be rerouted to another (e.g., non-blocked) speaker or speakers.

In some embodiments, sensors 301-312 may include one or more infrared (IR) sensors that may detect a change in IR light or a low level of IR light (e.g., in IR light intensity or the like). For example, such IR sensors may be located at one or more locations around casing 320 (e.g., near speakers 201-208) and such IR sensors may be activated when they are obstructed (e.g., by a user's hand or the like) based on the change or low level of IR light. Activation of such IR sensors may cause redirection of sound from associated or adjacent speakers to other speakers as discussed herein.

In some embodiments, sensors 301-312 may include one or more thermometers, thermocouples or the like that may detect a change in temperature (e.g., a localized change in temperature or temperature measurement). For example, such temperature sensors may be located at one or more locations around casing 320 (e.g., near speakers 201-208) and such temperature sensors may indicate temperature and/or a change in temperature (e.g., based on a user's body temperature or the like). Activation or triggering via such temperature sensors and any associated control circuitry may cause redirection of sound from associated or adjacent speakers to other speakers as discussed herein.

In some embodiments, sensors 301-312 may include one or more electrical sensors that may detect a change resistance, a change in conductivity, or the like. In some embodiments, sensors 301-312 may be integrated into casing 320 of device 200 or a speaker frame of any one of speakers 201-208. For example, electrical sensors such as electromagnetic conductivity sensors or the like may be integrated into casing 320 and/or a speaker frame of any one of speakers 201-208. In such examples, the presence of a human finger or the like may cause a change in resistivity and/or conductivity of the sensors and/or casing 320. Such sensors may be located at one or more locations and, upon detection of an obstructed speaker, may be used to redirect sound from associated or adjacent speakers to other speakers as discussed herein.

In some embodiments, sensors 301-312 may be implemented via one or more of the materials of casing 320 (e.g., casing 320 may include a sensor material). For example, casing 320 may include an electroactive polymer (EAP) such as a stimuli-responsive gel or the like. Such materials may exhibited changes in electrical properties based on a change in their shape, temperature, pressure, or the like. In such examples, such changes in casing 320 may indicate (e.g., via an electrical signal) a speaker is obstructed or partially obstructed and sound may be redirected to other speakers.

In some embodiments, sensors 301-312 may include miniature microphones placed near speaker locations. Such microphones may sample the sound from adjacent speakers (e.g., detect audio samples based on audio feedback from the speaker) and such audio samples may be evaluated to determine whether they are distorted or the like. If such audio samples are distorted (e.g., distortion is detected based on the returned audio feedback due to air vibrations, obstructions, or the like), sound may be redirected to other speakers as discussed herein.

As discussed, sensors 301-312 may be used to detect a speaker is obstructed or partially obstructed or the like and such indications may be used to redirect sound to other speakers. In some examples, sensors 301-312 may be used to detect a speaker is not obstructed (e.g., prior to redirecting sound to such a speaker) to verify the target speaker to which sound is being redirected is not also obstructed by the user or the like.

Returning to FIG. 1, at decision operation 102, if no sensor has been triggered, processing may continue at operation 101 and/or decision operation 102 with no changes made to the audio output of the device. If a sensor has been triggered (e.g., a partial or full obstruction of a speaker has been detected), processing may continue at decision operation 103, "Audio Strength Effected?", where a determination may be made as to whether an audio strength or an audio output or the like from the device is effected or impeded or the like based on the determination made at operation 102 that a speaker has been obstructed. Such a determination may be made using any suitable technique or techniques. For example, an audio output from the device may be detected or attained via a microphone such as microphone 209 or the like of device 200 (please refer to FIG. 2). In some examples, the audio output from the device may be detected via an only or general microphone of device 200.

In some embodiments, the determination of whether the audio output is impeded may be based on determining whether the audio sample is distorted or the like. Such a distortion may be evaluated using any suitable technique or techniques. In some examples, the determination of such a distortion may be determined via software implemented via device 200. In some examples, the determination of such a distortion may be based on a comparison of the volume of the audio sample to an expected volume of the audio sample. For example, if the difference between the expected volume of the audio sample and the volume of the audio sample is greater than a threshold, the audio strength or audio output may be determined to be effected or impeded at determination operation 103. In some examples, a decibel (dB) strength of the audio sample may be compared to a threshold, an expected dB strength or the like to determine whether the audio strength is effected. In some examples, the audio strength or audio output may be compared to a predetermined threshold.

If the audio strength or audio output is not effected or impeded, processing may continue at operation 101 and/or decision operations 102, 103 with no changes made to the audio output of the device. If the audio strength or audio output is effected or impeded, processing may continue at operation 104, "Determine Alternative Speaker(s)", where one or more alternative speakers may be determined for balancing audio. The one or more alternative speakers may be determined using any suitable technique or techniques.

In some examples, the one or more alternative speakers may be determined based on proximity to the speaker or speakers that are obstructed. For example, the one or more alternative speakers may be the speaker or speakers that are proximate to the speaker or speakers that are obstructed. In some examples, the one or more alternative speakers may be determined based on an orientation of the device. For example, device 200 may include a gyroscope or the like that provides an orientation of device 200. In such examples, the one or more alternative speakers may be selected as those that are upward facing or horizontal facing or the like. In some examples, a 3-dimensional (3D) model of the audio of the device may be generated based on the device features (e.g., number and locations of speakers), the obstruction of the speaker, the distortion of the effect of the obstruction on the audio strength, and the like. Such a 3D model may be solved or approximated to redirect audio to other speakers to optimize output from the device despite the obstruction(s).

Furthermore, in some embodiments, process 100 may include, prior to operation 105, an operation to determine whether the one or more alternative speakers are also obstructed. Such obstructions may be detected using any suitable technique or techniques such as those discussed with respect to decision operation 102. If the one or more alternative speakers are not obstructed, processing may continue at operation 105. If the one or more alternative speakers are obstructed, processing may continue at operation 104, where one or more alternative speakers (e.g., alternatives to the current one or more alternative speakers) may be determined.

As shown, processing may continue at operation 105, "Balance Audio to Alternative Speaker(s)", where audio may be balanced to the one or more alternative speakers. The audio may be balanced using any suitable technique or techniques. For example, an output from the one or more alternative speakers may be initiated or increased to balance the audio for device 200. For example, the driver power or the like to the one or more alternative speakers may be increased to generate greater volume from the one or more alternative speakers. The output from the one or more alternative speakers may be increased by any suitable amount or amounts. In some examples, the output from the one or more alternative speakers may be based on a comparison of the volume of the audio sample and the expected volume of the audio sample as determined at operation 103.

As discussed, if a speaker or speakers are determined to be obstructed (e.g., based on signals from adjacent sensors), audio may be balanced to alternative speakers. In addition or in the alternative, output from the obstructed speaker may also be increased. The output from the obstructed speaker may be implemented using any suitable technique or techniques such as increasing a drive power for the speaker or the like.

Processing may continue at decision operation 106, "Alert User On?", where a determination may be made as to whether an option to alert a user is on or enabled. For example, a user notification or alert may be provided to alert or notify a user that a speaker obstruction has been detected and is being corrected for. In some examples, the user alert functionality may be enabled by a user via software or the like. Such user alerts may be provided in addition to or in the alternative to the audio balancing discussed herein. If the alert user functionality is not enabled, processing may continue at operation 101 as discussed herein.

If the alert user functionality is enabled, processing may continue at operation 107, "Alert User", where the user may be alerted or notified or the like that a speaker or speakers are obstructed (e.g., that the user is incorrectly holding the device for optimal audio). The user notification or alert may include any suitable notification such as an audio tone (e.g., provided via one or more of speakers 201-208 such as an unobstructed speaker), a visual indicator (e.g., via display 220), a vibration, or the like. In some examples, the notification or indicator may include an indicator as to which speaker or speakers are being obstructed (e.g., an icon or graphic indicating obstructed speaker), a level of adjustment being applied (e.g., an icon or graphic indicating audio is being rebalanced and, optionally, the amount of rebalancing), an example hand position to remove the obstruction, (e.g., an icon or graphic indicating a proper hand holding or unobstructed orientation of the device), or the like. As discussed, in some embodiments, audio balancing may be accompanied by on-screen alerts (e.g., presented via a display), vibrations, audio alerts, or the like to alert the user and/or providing indications or instructions for the user to follow to improve the audio output (e.g., via repositioning the device, objects near the device, their grip of the device, or the like).

As discussed, process 100 may provide audio balancing for a device such as device 200 or the like. Process 100 or portions thereof may be repeated in series or in parallel for any number of audio usages and/or any number of speaker obstructions. In some examples, an obstruction being removed from a speaker may be detected and audio may be balanced based on the obstruction being removed. In some embodiments, a sensor associated with an obstructed speaker may be monitored and, when the obstruction is removed, the audio may be rebalanced to all in use speakers according to a predetermined balance or the like.

Also as discussed, process 100 may be implemented via any suitable device such as a mobile device or a wearable device or the like.

Figure 4:
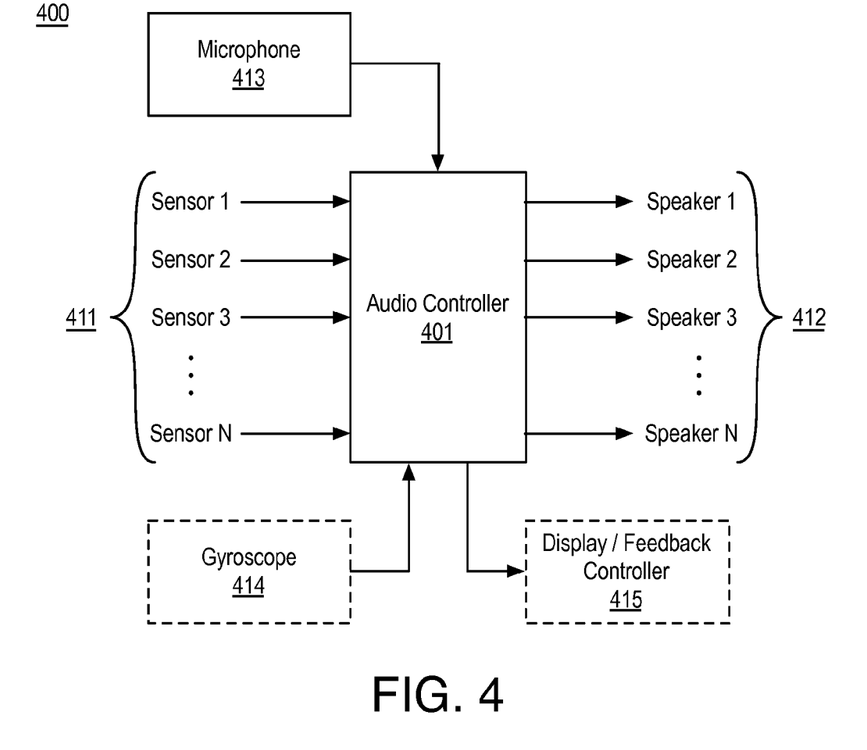
FIG. 4 illustrates an example audio system.

FIG. 4 illustrates an example audio system 400, arranged in accordance with at least some implementations of the present disclosure. As shown in FIG. 4, audio system 400 may include an audio controller 401, sensors 411, speakers 412, microphone 413, an optional gyroscope 414, and an optional display/feedback controller 415. In some examples, audio controller 401 and/or display/feedback controller 415 may be implemented via a central processor or the like as discussed with respect to system 600 herein. Furthermore, audio system 400 may be implemented via any suitable form factor device such as those discussed herein.

As shown, audio system 400 may include any number of sensors 411 such as N sensors. For example, sensors 411 may be provided via a device such as device 200 in any suitable manner. Furthermore, audio system 400 may include any number of speakers 412 (e.g., one or more speakers) such as N speakers. In the illustrated example, the number of sensors 411 and speakers 412 is the same and each sensor may be associated with a speaker (e.g., sensor 1 may be associated with speaker 1, sensor 2 may be associated with speaker 2, and so on). For example, sensor 1 may monitor speaker 1 for an obstruction, sensor 1 may monitor speaker 1 for an obstruction, and so on. Sensors 411 may be any sensors as discussed herein with respect to sensors 301-312. In some embodiments, sensors 411 are all of the same type. In other embodiments, sensors 411 include sensors of different types.

Furthermore, audio system 400 may include microphone 413 for attaining audio samples, gyroscope 414 for providing orientation data, and display/feedback controller 415 for generating notifications or other feedback indicating to a user one or more of speakers 412 is at least partially obstructed.

For example, sensors 411 may provide input to audio controller 401 at regular intervals and/or when a characteristic indicative of an obstruction is detected. Audio controller 401 may receive such input and provide output (e.g., audio streams or the like) to speakers 412 based on the input and a balancing of audio. For example, if sensor 2 indicates speaker 2 is at least partially obstructed, audio controller 401 may divert audio from speaker 2 to an alternative or secondary speaker or speakers. The alternative speaker or speakers may be proximate to speaker 2 (e.g., the closest) and/or advantageous based on an orientation of the device as indicated via gyroscope 414 and/or a 3D modeling of the device as discussed herein. In some examples, a predetermined mapping of obstructed speaker(s) to alternative speaker(s) may be generated (e.g., generated offline) and implemented via the device for real-time operations. In some embodiments, the alternative speaker may be an upright facing speaker or a horizontal speaker (e.g., such speakers may be more likely to be unobstructed and facing a user) or the like. In some examples, a sensor associated with the alternative speaker may be monitored or evaluated to ensure the alternative speaker is not also obstructed. For example, if the alternative to speaker 2 is speaker 3, the signal associated with sensor 3 may be monitored to ensure alternative speaker is not also obstructed. If it is obstructed another alternative speaker may be selected.

Also, as shown, in some examples, when an obstruction is determined, a signal may be provided to display/feedback controller 415, which may generate an indicator to alert the user of the obstruction. The indicator may be implemented via one or more of speakers 412 (e.g., as an auditory tone or the like), via a display (not shown), via a vibration (not shown), or the like.

Figure 5:
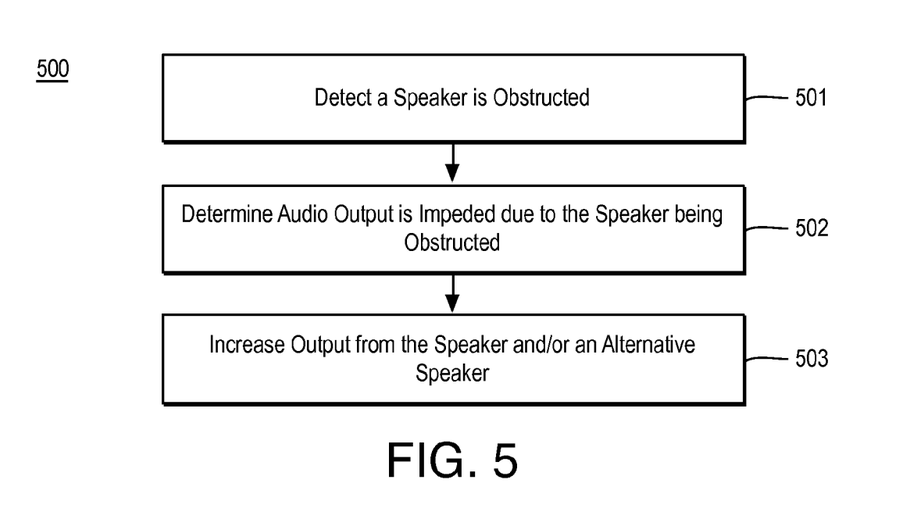
FIG. 5 is a flow diagram illustrating an example process for performing audio balancing.

FIG. 5 is a flow diagram illustrating an example process 500 for performing audio balancing, arranged in accordance with at least some implementations of the present disclosure. Process 500 may include one or more operations 501-503 as illustrated in FIG. 5. Process 500 may form at least part of an audio balancing process. By way of non-limiting example, process 500 may form at least part of an audio balancing process as performed by device 200 or audio system 400 as discussed herein. Furthermore, process 500 will be described herein with reference to system 600 of FIG. 6.

Figure 6:
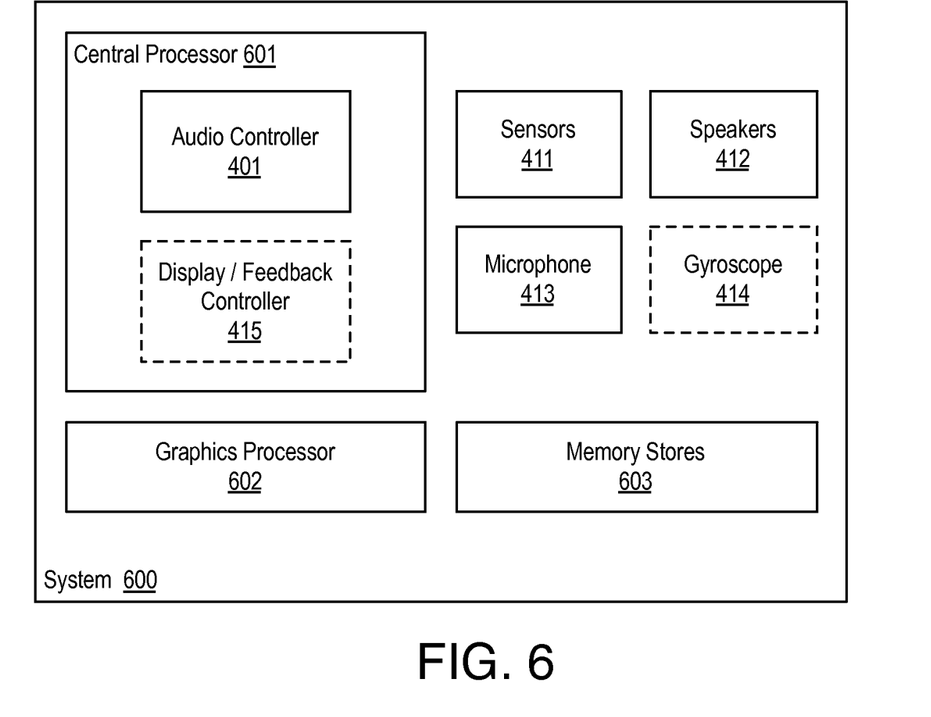
FIG. 6 is an illustrative diagram of an example system for performing audio balancing

FIG. 6 is an illustrative diagram of an example system 600 for performing audio balancing, arranged in accordance with at least some implementations of the present disclosure. As shown in FIG. 6, system 600 may include a central processor 601, sensors 411, speakers 412, microphone 413, gyroscope 414, graphics processor 602, and memory stores 603. Also as shown, central processor 601 may include audio controller 601 and/or optional display/feedback controller 415. In the example of system 600, memory stores 603 may store audio data, sensor data, or related data or content such as audio input signal data, audio samples, sensor data, sensor threshold data, user notification data, and/or any other data as discussed herein.

As shown, in some examples, audio controller 401 and/or optional display/feedback controller 415 may be implemented via central processor 601. In other examples, one or more or portions of audio controller 601 and/or optional display/feedback controller 415 may be implemented via an audio signal processor, dedicated hardware, fixed function circuitry, an execution unit or units, or the like. Fixed function circuitry may include, for example, dedicated logic or circuitry and may provide a set of fixed function entry points that may map to the dedicated logic for a fixed purpose or function. An execution (EU) may include, for example, programmable logic or circuitry such as a logic core or cores that may provide a wide array of programmable logic functions.

Central processor 601 may include any number and type of processing units or modules that may provide control and other high level functions for system 600 and/or provide any operations as discussed herein. Memory stores 603 may be any type of memory such as volatile memory (e.g., Static Random Access Memory (SRAM), Dynamic Random Access Memory (DRAM), etc.) or non-volatile memory (e.g., flash memory, etc.), and so forth. In a non-limiting example, memory stores 603 may be implemented by cache memory.

Returning to discussion of FIG. 5, process 500 may begin at operation 501, "Detect a Speaker is Obstructed", where a speaker of the device being at least partially obstructed may be detected. For example, audio controller 401 as implemented via central processor 601, based on signals received from or monitoring of sensors 411, may determine a speaker of the device is at least partially obstructed. The detection of a speaker of the device being at least partially obstructed may be performed using any suitable technique or techniques.

In some embodiments, detecting the speaker of the device is at least partially obstructed may include detecting, adjacent to the speaker, physical pressure, a change in infrared light, a change in temperature, a change in resistance, a change in conductivity, or a change in shape of a casing of the device. In some embodiments, detecting the speaker of the device is at least partially obstructed may include detecting, via a sensor integrated into a casing of the device, physical pressure, a change in temperature, a change in resistance, a change in conductivity, or a change in shape of the casing of the device. In some embodiments, detecting the speaker of the device is at least partially obstructed may include detecting, via a miniature microphone adjacent to the speaker, an audio sample and determining the audio sample is distorted. In some embodiments, detecting the speaker of the device is at least partially obstructed may include detecting, via an infrared sensor, a change in infrared light adjacent to the speaker. In some embodiments, detecting the speaker of the device is at least partially obstructed may include detecting, via a stimuli-responsive gel, a change in at least one of temperature, pressure, or a shape of a case of the device adjacent to the speaker.

As discussed, the detection of a speaker being obstructed or partially obstructed may be based on signals received from or monitoring of sensors 411. Sensors 411 may include any suitable sensors. In some embodiments, sensors 411 may include an infrared sensor, a thermocouple, a resistance thermometer, or a tactile sensor. In some embodiments, sensors 411 may include a sensor integrated into a casing of the device to detect at least one of physical pressure, a change in temperature, a change in resistance, a change in conductivity, or a change in shape of the casing of the device. In some embodiments, sensors 411 may include a miniature microphone adjacent to the speaker to detect an audio sample from an associated speaker or speakers.

Process 500 may continue at operation 502, "Determine Audio Output is Impeded due to the Speaker being Obstructed", where a determination may be made that an audio output from the device is impeded due to the speaker being at least partially obstructed. For example, audio controller 401 as implemented via central processor 601, based on an audio sample received from microphone 413, may determine they audio output from the device is impeded due to the speaker being at least partially obstructed. Such a determination may be made using any suitable technique or techniques. In some embodiments, determining the audio output from the device is impeded may include detecting, via microphone 413, an audio sample and determining the audio sample is distorted. For example, determining the audio sample is distorted may include comparing a volume of the audio sample to an expected volume of the audio sample.

Process 500 may continue at operation 503, "Increase Output from the Speaker and/or an Alternative Speaker", where an output from the speaker and/or an alternative speaker may be increased based on the audio output from the device being impeded. For example, audio controller 401 as implemented via central processor 601 may increase the output from the obstructed speaker and/or one or more alternative speakers of speakers 412.

In some examples, prior to operation 503, one or more alternative speakers to the obstructed speaker may be determined, in response to determining the audio output from the device is impeded, using any suitable technique or techniques. Furthermore, prior to operation 503, the increase in the output from the speaker and/or alternative speakers may be determined using any suitable technique or techniques. In some embodiments, the one or more alternative speakers or the output from the speaker and/or alternative speakers may be determined based on an orientation of the device. For example, an orientation of the device may be generated via gyroscope 414 and received via audio controller 401. Furthermore, in some embodiments, prior to operation 503, a determination or verification may be made that the alternative speaker or speakers are not obstructed. For example, audio controller 401 may, via monitoring sensors 411, verify no obstruction is associated with the one or more alternative speakers.

In some embodiments, process 500 may include providing a notification to a user indicating the speaker is at least partially obstructed. For example, display/feedback controller 415 as implemented via central processor 601 may provide a notification to a user indicating the speaker is at least partially obstructed. The notification may be provided via any suitable signaling of the user such as a vibration, an auditory signal, or a visual signal. In some examples, system 600 may include a display (not shown) coupled to central processor 601 and central processor 601 may provide an indicator of the obstructed speaker to a user via the display.

Process 500 may be repeated any number of times either in series or in parallel to perform audio balancing for a device such as a mobile device, a wearable device, or the like. As discussed, process 500 may provide audio balancing and/or the elimination or prevention of audio distortions in mobile devices or wearable devices or the like. Such techniques may provide for excellent user experience and higher sound quality.

Various components of the systems described herein may be implemented in software, firmware, and/or hardware and/or any combination thereof. For example, various components of device 200, audio system 400, system 600, system 700, or device 800 may be provided, at least in part, by hardware of a computing System-on-a-Chip (SoC) such as may be found in a mobile device. Those skilled in the art may recognize that systems described herein may include additional components that have not been depicted in the corresponding figures.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of device 200, audio system 400, system 600, system 700, device 800, or any other module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Figure 7:
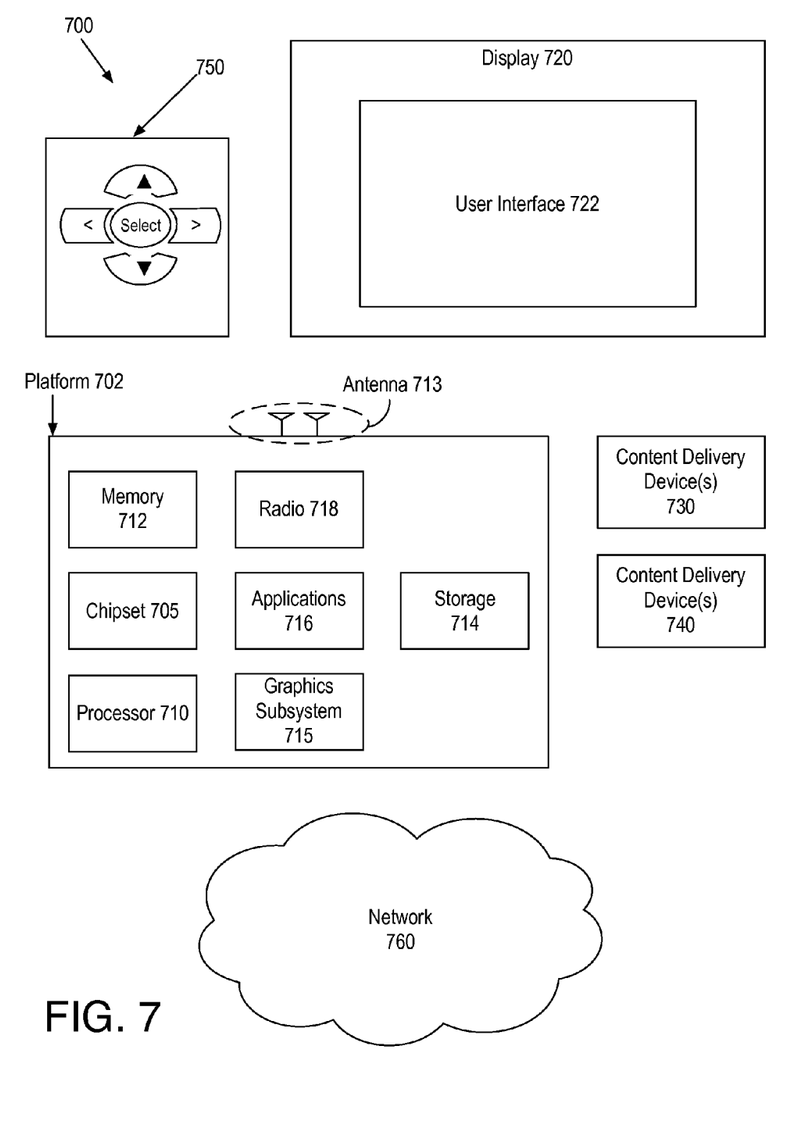
FIG. 7 is an illustrative diagram of an example system.

FIG. 7 is an illustrative diagram of an example system 700, arranged in accordance with at least some implementations of the present disclosure. In various implementations, system 700 may be an audio system or a media system although system 700 is not limited to this context. For example, system 700 may be incorporated into a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, cameras (e.g. point-and-shoot cameras, super-zoom cameras, digital single-lens reflex (DSLR) cameras), and so forth.

In various implementations, system 700 includes a platform 702 coupled to an optional display 720. Platform 702 may receive content from a content device such as content services device(s) 730 or content delivery device(s) 740 or other similar content sources. An optional navigation controller 750 including one or more navigation features may be used to interact with, for example, platform 702 and/or display 720. Each of these components is described in greater detail below.

In various implementations, platform 702 may include any combination of a chipset 705, processor 710, memory 712, antenna 713, storage 714, graphics subsystem 715, applications 716 and/or radio 718. Chipset 705 may provide intercommunication among processor 710, memory 712, storage 714, graphics subsystem 715, applications 716 and/or radio 718. For example, chipset 705 may include a storage adapter (not depicted) capable of providing intercommunication with storage 714.

Processor 710 may be implemented as a Complex Instruction Set Computer (CISC) or Reduced Instruction Set Computer (RISC) processors, x86 instruction set compatible processors, multi-core, or any other microprocessor or central processing unit (CPU). In various implementations, processor 710 may be dual-core processor(s), dual-core mobile processor(s), and so forth.

Memory 712 may be implemented as a volatile memory device such as, but not limited to, a Random Access Memory (RAM), Dynamic Random Access Memory (DRAM), or Static RAM (SRAM).

Storage 714 may be implemented as a non-volatile storage device such as, but not limited to, a magnetic disk drive, optical disk drive, tape drive, an internal storage device, an attached storage device, flash memory, battery backed-up SDRAM (synchronous DRAM), and/or a network accessible storage device. In various implementations, storage 714 may include technology to increase the storage performance enhanced protection for valuable digital media when multiple hard drives are included, for example.

Graphics subsystem 715 may perform processing of images such as still or video for display. Graphics subsystem 715 may be a graphics processing unit (GPU) or a visual processing unit (VPU), for example. An analog or digital interface may be used to communicatively couple graphics subsystem 715 and display 720. For example, the interface may be any of a High-Definition Multimedia Interface, DisplayPort, wireless HDMI, and/or wireless HD compliant techniques. Graphics subsystem 715 may be integrated into processor 710 or chipset 705. In some implementations, graphics subsystem 715 may be a stand-alone device communicatively coupled to chipset 705.

The audio processing techniques described herein may be implemented in various hardware architectures. For example, audio processing functionality may be integrated within a chipset. Alternatively, a discrete audio and/or media processor may be used. As still another implementation, the audio processing functions may be provided by a general purpose processor, including a multi-core processor. In further embodiments, the functions may be implemented in a consumer electronics device.

Radio 718 may include one or more radios capable of transmitting and receiving signals using various suitable wireless communications techniques. Such techniques may involve communications across one or more wireless networks. Example wireless networks include (but are not limited to) wireless local area networks (WLANs), wireless personal area networks (WPANs), wireless metropolitan area network (WMANs), cellular networks, and satellite networks. In communicating across such networks, radio 718 may operate in accordance with one or more applicable standards in any version.

In various implementations, display 720 may include any television type monitor or display. Display 720 may include, for example, a computer display screen, touch screen display, video monitor, television-like device, and/or a television. Display 720 may be digital and/or analog. In various implementations, display 720 may be a holographic display. Also, display 720 may be a transparent surface that may receive a visual projection. Such projections may convey various forms of information, images, and/or objects. For example, such projections may be a visual overlay for a mobile augmented reality (MAR) application. Under the control of one or more software applications 716, platform 702 may display user interface 722 on display 720.

In various implementations, content services device(s) 730 may be hosted by any national, international and/or independent service and thus accessible to platform 702 via the Internet, for example. Content services device(s) 730 may be coupled to platform 702 and/or to display 720. Platform 702 and/or content services device(s) 730 may be coupled to a network 760 to communicate (e.g., send and/or receive) media information to and from network 760. Content delivery device(s) 740 also may be coupled to platform 702 and/or to display 720.

In various implementations, content services device(s) 730 may include a cable television box, personal computer, network, telephone, Internet enabled devices or appliance capable of delivering digital information and/or content, and any other similar device capable of uni-directionally or bi-directionally communicating content between content providers and platform 702 and/display 720, via network 760 or directly. It will be appreciated that the content may be communicated uni-directionally and/or bi-directionally to and from any one of the components in system 700 and a content provider via network 760. Examples of content may include any media information including, for example, video, music, medical and gaming information, and so forth.

Content services device(s) 730 may receive content such as cable television programming including media information, digital information, and/or other content. Examples of content providers may include any cable or satellite television or radio or Internet content providers. The provided examples are not meant to limit implementations in accordance with the present disclosure in any way.

In various implementations, platform 702 may receive control signals from navigation controller 750 having one or more navigation features. The navigation features of controller 750 may be used to interact with user interface 722, for example. In various embodiments, navigation controller 750 may be a pointing device that may be a computer hardware component (specifically, a human interface device) that allows a user to input spatial (e.g., continuous and multi-dimensional) data into a computer. Many systems such as graphical user interfaces (GUI), and televisions and monitors allow the user to control and provide data to the computer or television using physical gestures.

Movements of the navigation features of controller 750 may be replicated on a display (e.g., display 720) by movements of a pointer, cursor, focus ring, or other visual indicators displayed on the display. For example, under the control of software applications 716, the navigation features located on navigation controller 750 may be mapped to virtual navigation features displayed on user interface 722, for example. In various embodiments, navigation controller 750 may not be a separate component but may be integrated into platform 702 and/or display 720. The present disclosure, however, is not limited to the elements or in the context shown or described herein.

In various implementations, drivers (not shown) may include technology to enable users to instantly turn on and off platform 702 like a television with the touch of a button after initial boot-up, when enabled, for example. Program logic may allow platform 702 to stream content to media adaptors or other content services device(s) 730 or content delivery device(s) 740 even when the platform is turned "off." In addition, chipset 705 may include hardware and/or software support for 5.1 surround sound audio and/or high definition 7.1 surround sound audio, for example. Drivers may include a graphics driver for integrated graphics platforms. In various embodiments, the graphics driver may comprise a peripheral component interconnect (PCI) Express graphics card.

In various implementations, any one or more of the components shown in system 700 may be integrated. For example, platform 702 and content services device(s) 730 may be integrated, or platform 702 and content delivery device(s) 740 may be integrated, or platform 702, content services device(s) 730, and content delivery device(s) 740 may be integrated, for example. In various embodiments, platform 702 and display 720 may be an integrated unit. Display 720 and content service device(s) 730 may be integrated, or display 720 and content delivery device(s) 740 may be integrated, for example. These examples are not meant to limit the present disclosure.

In various embodiments, system 700 may be implemented as a wireless system, a wired system, or a combination of both. When implemented as a wireless system, system 700 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 700 may include components and interfaces suitable for communicating over wired communications media, such as input/output (I/O) adapters, physical connectors to connect the I/O adapter with a corresponding wired communications medium, a network interface card (NIC), disc controller, video controller, audio controller, and the like. Examples of wired communications media may include a wire, cable, metal leads, printed circuit board (PCB), backplane, switch fabric, semiconductor material, twisted-pair wire, co-axial cable, fiber optics, and so forth.

Platform 702 may establish one or more logical or physical channels to communicate information. The information may include media information and control information. Media information may refer to any data representing content meant for a user. Examples of content may include, for example, data from a voice conversation, videoconference, streaming video, electronic mail ("email") message, voice mail message, alphanumeric symbols, graphics, image, video, text and so forth. Data from a voice conversation may be, for example, speech information, silence periods, background noise, comfort noise, tones and so forth. Control information may refer to any data representing commands, instructions or control words meant for an automated system. For example, control information may be used to route media information through a system, or instruct a node to process the media information in a predetermined manner. The embodiments, however, are not limited to the elements or in the context shown or described in FIG. 7.

Figure 8:
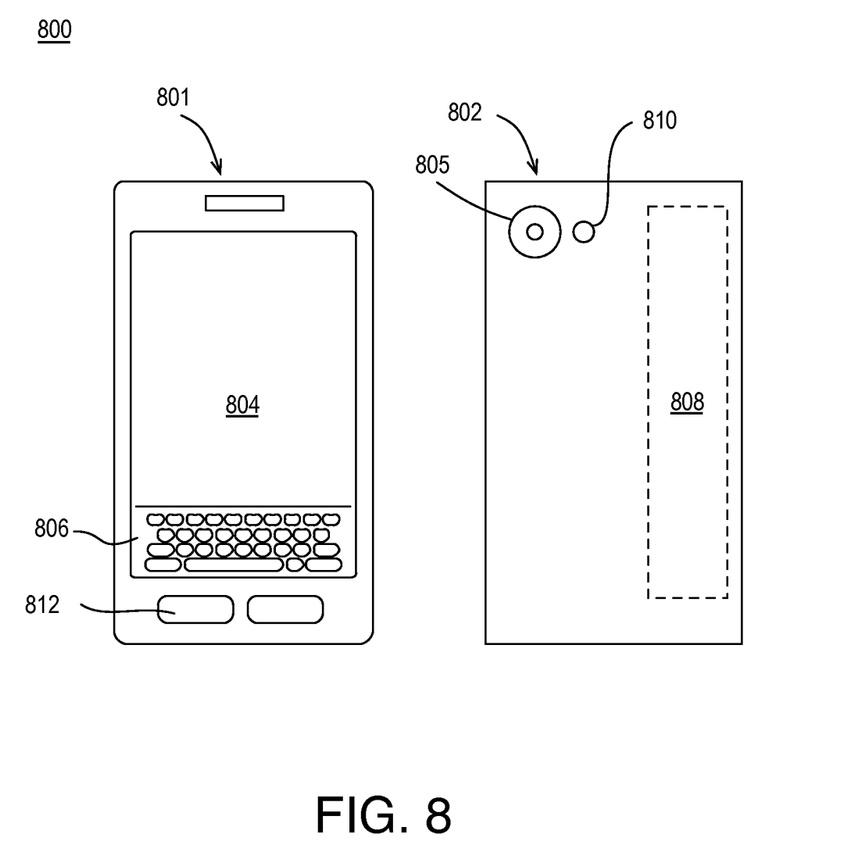
FIG. 8 illustrates an example small form factor device, all arranged in accordance with at least some implementations of the present disclosure.

As described above, system 700 may be embodied in varying physical styles or form factors. FIG. 8 illustrates an example small form factor device 800, arranged in accordance with at least some implementations of the present disclosure. In some examples, system 700 may be implemented via device 800. In other examples, device 200, audio system 400, or portions thereof may be implemented via device 800. In various embodiments, for example, device 800 may be implemented as a mobile computing device a having wireless capabilities. A mobile computing device may refer to any device having a processing system and a mobile power source or supply, such as one or more batteries, for example.

Examples of a mobile computing device may include a personal computer (PC), laptop computer, ultra-laptop computer, tablet, touch pad, portable computer, handheld computer, palmtop computer, personal digital assistant (PDA), cellular telephone, combination cellular telephone/PDA, smart device (e.g., smart phone, smart tablet or smart mobile television), mobile internet device (MID), messaging device, data communication device, cameras, and so forth.

Examples of a mobile computing device also may include computers that are arranged to be worn by a person, such as a wrist computers, finger computers, ring computers, eyeglass computers, belt-clip computers, arm-band computers, shoe computers, clothing computers, and other wearable computers. In various embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

As shown in FIG. 8, device 800 may include a housing with a front 801 and a back 802. Device 800 includes a display 804, an input/output (I/O) device 806, and an integrated antenna 808. Device 800 also may include navigation features 812. I/O device 806 may include any suitable I/O device for entering information into a mobile computing device. Examples for I/O device 806 may include an alphanumeric keyboard, a numeric keypad, a touch pad, input keys, buttons, switches, microphones, speakers, voice recognition device and software, and so forth. Information also may be entered into device 800 by way of microphone (not shown), or may be digitized by a voice recognition device. As shown, device 800 may include a camera 805 (e.g., including a lens, an aperture, and an imaging sensor), a camera 807 (e.g., including a lens, an aperture, and an imaging sensor), and a flash 810 integrated into back 802 (or elsewhere) of device 800. In other examples, cameras 805, 807, and flash 810 may be integrated into front 801 of device 800 and/or additional cameras (e.g., such that device 800 has front and back cameras) may be provided. Cameras 805, 807 may be components of a stereo camera module to originate stereo image data and/or stereo video data that may be output to display 804 and/or communicated remotely from device 800 via antenna 808 for example.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further embodiments.

In one or more first embodiments, a method for performing audio balancing for a device comprises detecting a speaker of the device is at least partially obstructed, determining an audio output from the device is impeded due to the speaker being at least partially obstructed, and increasing an output from at least one of the speaker or a second speaker based on the audio output from the device being impeded.

Further to the first embodiments, detecting the speaker of the device is at least partially obstructed comprises detecting, adjacent to the speaker, at least one of physical pressure, a change in infrared light, a change in temperature, a change in resistance, a change in conductivity, or a change in shape of a casing of the device.

Further to the first embodiments, detecting the speaker of the device is at least partially obstructed comprises detecting, via a sensor integrated into a casing of the device, at least one of physical pressure, a change in temperature, a change in resistance, a change in conductivity, or a change in shape of the casing of the device.

Further to the first embodiments, detecting the speaker of the device is at least partially obstructed comprises detecting, via a miniature microphone adjacent to the speaker, an audio sample and determining the audio sample is distorted.

Further to the first embodiments, detecting the speaker of the device is at least partially obstructed comprises detecting, via an infrared sensor, a change in infrared light adjacent to the speaker.

Further to the first embodiments, detecting the speaker of the device is at least partially obstructed comprises detecting, via a stimuli-responsive gel, a change in at least one of temperature, pressure, or a shape of a case of the device adjacent to the speaker.

Further to the first embodiments, detecting the speaker of the device is at least partially obstructed comprises detecting, via an infrared sensor, a change in infrared light adjacent to the speaker and/or detecting, via a stimuli-responsive gel, a change in at least one of temperature, pressure, or a shape of a case of the device adjacent to the speaker.

Further to the first embodiments, determining the audio output from the device is impeded comprises detecting, via a microphone of the device, an audio sample and determining the audio sample is distorted.

Further to the first embodiments, determining the audio output from the device is impeded comprises detecting, via a microphone of the device, an audio sample and determining the audio sample is distorted, wherein determining the audio sample is distorted comprises comparing a volume of the audio sample to an expected volume of the audio sample.

Further to the first embodiments, the method further comprises determining, in response to determining the audio output from the device is impeded, at least one alternative speaker and increasing an output from the alternative speaker.

Further to the first embodiments, the method further comprises determining, in response to determining the audio output from the device is impeded, at least one alternative speaker and increasing an output from the alternative speaker, wherein at least one of the alternative speaker or the output from the alternative speaker are determined based on an orientation of the device.

Further to the first embodiments, the method further comprises determining, in response to determining the audio output from the device is impeded, at least one alternative speaker and increasing an output from the alternative speaker, and/or wherein at least one of the alternative speaker or the output from the alternative speaker are determined based on an orientation of the device.

Further to the first embodiments, the method further comprises determining, in response to determining the audio output from the device is impeded, at least one alternative speaker proximate to the speaker, verifying no obstruction is associated with the alternative speaker, increasing an output from the alternative speaker based on a comparison of a volume of the audio sample to an expected volume of the audio sample.

Further to the first embodiments, the method further comprises providing a notification to a user indicating the speaker is at least partially obstructed.

In one or more second embodiments, a device comprises at least one speaker to provide audio output, at least one sensor adjacent to the speaker to detect an obstruction of the speaker, at least one microphone to detect an audio sample from the device, and a central processor to determine, based on a signal from the at least one sensor, the at least one speaker is obstructed, to determine, based on the audio sample, audio from the device is impeded, and to increase an output from at least one of the speaker or a second speaker based on the audio from the device being impeded.

Further to the second embodiments, the sensor to detect the obstruction of the speaker comprises the sensor to detect, adjacent to the speaker, at least one of physical pressure, a change in infrared light, a change in temperature, a change in resistance, a change in conductivity, or a change in shape of a casing of the device.

Further to the second embodiments, the sensor comprises at least one of an infrared sensor, a thermocouple, a resistance thermometer, or a tactile sensor.

Further to the second embodiments, the sensor comprises a sensor integrated into a casing of the device to detect at least one of physical pressure, a change in temperature, a change in resistance, a change in conductivity, or a change in shape of the casing of the device.

Further to the second embodiments, the sensor comprises at least one of an infrared sensor, a thermocouple, a resistance thermometer, or a tactile sensor or the sensor comprises a sensor integrated into a casing of the device to detect at least one of physical pressure, a change in temperature, a change in resistance, a change in conductivity, or a change in shape of the casing of the device.

Further to the second embodiments, the sensor comprises a stimuli-responsive gel to detect a change in at least one of temperature, pressure, or a shape of a case of the device adjacent to the speaker.

Further to the second embodiments, the sensor comprises a miniature microphone adjacent to the speaker and the audio controller is to determine a second audio sample detected via the miniature microphone is distorted and to increase the output based on the distorted audio sample.

Further to the second embodiments, the central processor to determine the audio output from the device is impeded comprises the central processor to compare a volume of the audio sample to an expected volume of the audio sample.

Further to the second embodiments, the central processor is to determine, in response to the audio output from the device being impeded, at least one alternative speaker proximate to the speaker, to verify no obstruction is associated with the alternative speaker, and to increase an output from the alternative speaker, wherein the increase is based on a comparison of a volume of the audio sample to an expected volume of the audio sample.

Further to the second embodiments, the central processor is to determine, in response to the audio output from the device being impeded, at least one alternative speaker proximate to the speaker, to verify no obstruction is associated with the alternative speaker, and to increase an output from the alternative speaker, wherein the increase is based on a comparison of a volume of the audio sample to an expected volume of the audio sample, and the device further comprises a gyroscope to determine an orientation of the device, wherein the central processor is to determine the alternative speaker based at least in part on the orientation of the device.

Further to the second embodiments, the device further comprises a display coupled to the central processor, wherein the central processor is to provide an indicator of the obstructed speaker to a user via the display.

Further to the second embodiments, the device further comprises a gyroscope to determine an orientation of the device, wherein the central processor is to determine the alternative speaker based at least in part on the orientation of the device, and/or a display coupled to the central processor, wherein the central processor is to provide an indicator of the obstructed speaker to a user via the display.

In one or more third embodiments, a system for performing audio balancing for a device comprises means for detecting a speaker of the device is at least partially obstructed, means for determining an audio output from the device is impeded due to the speaker being at least partially obstructed, and means for increasing an output from at least one of the speaker or a second speaker based on the audio output from the device being impeded.

Further to the third embodiments, the means for detecting the speaker of the device is at least partially obstructed comprise means for detecting, adjacent to the speaker, at least one of physical pressure, a change in infrared light, a change in temperature, a change in resistance, a change in conductivity, or a change in shape of a casing of the device.

Further to the third embodiments, the means for detecting the speaker of the device is at least partially obstructed comprise a sensor integrated into a casing of the device to detect at least one of physical pressure, a change in temperature, a change in resistance, a change in conductivity, or a change in shape of the casing of the device.

Further to the third embodiments, the means for detecting the speaker of the device is at least partially obstructed comprise a miniature microphone adjacent to the speaker to detect an audio sample and means for determining the audio sample is distorted.

Further to the third embodiments, the means for detecting the speaker of the device is at least partially obstructed comprise an infrared sensor to detect a change in infrared light adjacent to the speaker.

Further to the third embodiments, the means for detecting the speaker of the device is at least partially obstructed comprise a stimuli-responsive gel to detect a change in at least one of temperature, pressure, or a shape of a case of the device adjacent to the speaker.

Further to the third embodiments, the means for determining the audio output from the device is impeded comprise means for detecting, via a microphone of the device, an audio sample and means for determining the audio sample is distorted.

Further to the third embodiments, the means for determining the audio output from the device is impeded comprise means for detecting, via a microphone of the device, an audio sample and means for determining the audio sample is distorted, wherein the means for determining the audio sample is distorted comprise means for comparing a volume of the audio sample to an expected volume of the audio sample.

Further to the third embodiments, the system further comprises means for determining, in response to determining the audio output from the device is impeded, at least one alternative speaker and means for increasing an output from the alternative speaker.

Further to the third embodiments, the system further comprises means for determining, in response to determining the audio output from the device is impeded, at least one alternative speaker and means for increasing an output from the alternative speaker, wherein at least one of the alternative speaker or the output from the alternative speaker are determined based on an orientation of the device.

Further to the third embodiments, the system further comprises means for determining, in response to determining the audio output from the device is impeded, at least one alternative speaker proximate to the speaker, means for verifying no obstruction is associated with the alternative speaker, and means for increasing an output from the alternative speaker based on a comparison of a volume of the audio sample to an expected volume of the audio sample.

Further to the third embodiments, the system further comprises means for determining, in response to determining the audio output from the device is impeded, at least one alternative speaker proximate to the speaker, means for verifying no obstruction is associated with the alternative speaker, means for increasing an output from the alternative speaker based on a comparison of a volume of the audio sample to an expected volume of the audio sample, and means for providing a notification to a user indicating the speaker is at least partially obstructed.

In one or more fourth embodiments, at least one machine readable medium comprises a plurality of instructions that, in response to being executed on a device, cause the device to perform audio balancing by detecting a speaker of the device is at least partially obstructed, determining an audio output from the device is impeded due to the speaker being at least partially obstructed, and increasing an output from at least one of the speaker or a second speaker based on the audio output from the device being impeded.

Further to the fourth embodiments, detecting the speaker of the device is at least partially obstructed comprises determining an audio sample associated with the speaker is distorted.

Further to the fourth embodiments, the machine readable medium comprises further instructions that, in response to being executed on the device, cause the device to perform audio balancing by determining, in response to determining the audio output from the device is impeded, at least one alternative speaker and increasing an output from the alternative speaker.

Further to the fourth embodiments, the machine readable medium comprises further instructions that, in response to being executed on the device, cause the device to perform audio balancing by determining, in response to determining the audio output from the device is impeded, at least one alternative speaker, verifying no obstruction is associated with the alternative speaker, and increasing an output from the alternative speaker.

Further to the fourth embodiments, the alternative speaker is proximate to the speaker and increasing the output from the alternative speaker is based on a comparison of a volume of the audio sample to an expected volume of the audio sample.

In one or more fifth embodiments, at least one machine readable medium may include a plurality of instructions that in response to being executed on a computing device, causes the computing device to perform a method according to any one of the above embodiments.

In one or more sixth embodiments, an apparatus may include means for performing a method according to any one of the above embodiments.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. A method for performing audio balancing for a device comprising:
   providing audio from a first speaker of the device;
   determining whether a sensor adjacent to the first speaker has been triggered;
   when the sensor has been triggered:
      detecting, via a microphone of the device separate from the sensor, an audio sample provided by multiple speakers of the device including the first speaker; and
      determining whether the audio sample is distorted; and
   when the audio sample is distorted:
      determining at least one alternative speaker from the multiple speakers; and
      increasing an output from at least one of the first speaker or the alternative speaker.

2. The method of claim 1, wherein determining whether the sensor adjacent to the first speaker has been triggered comprises detecting at least one of physical pressure, a change in infrared light, a change in temperature, a change in resistance, a change in conductivity, or a change in shape of a casing of the device.

3. The method of claim 1, wherein the sensor is integrated into a casing of the device.

4. The method of claim 1, wherein the sensor is a miniature microphone and determining whether the sensor has been triggered comprises detecting a second audio sample and determining the second audio sample is distorted.

5. The method of claim 1, wherein the sensor is an infrared sensor and determining whether the sensor has been triggered comprises detecting a change in infrared light adjacent to the speaker.

6. The method of claim 1, wherein the sensor comprises a stimuli-responsive gel and determining whether the sensor has been triggered comprises detecting a change in at least one of temperature, pressure, or a shape of a case of the device adjacent to the speaker.

7. The method of claim 1, wherein the microphone is the only microphone of the device.

8. The method of claim 1, wherein determining whether the audio sample is distorted comprises comparing a volume of the audio sample to an expected volume of the audio sample.

9. The method of claim 1, wherein, when the sensor is not triggered or the audio sample is not distorted, no change is made to the audio from the first speaker.

10. The method of claim 1, wherein at least one of the alternative speaker or the output from the alternative speaker are determined based on an orientation of the device.

11. The method of claim 1, further comprising:
   verifying, prior to increasing an output from the alternative speaker, no obstruction is associated with the alternative speaker.

12. The method of claim 1, further comprising:
   providing, when the sensor has been triggered and the audio sample is distorted, a notification to a user indicating the speaker is at least partially obstructed.

13. A device comprising:
   a first speaker to provide audio output;
   a sensor adjacent to the first speaker to detect a triggering of the sensor;

a microphone separate from the sensor to detect, when the sensor has been triggered, an audio sample from multiple speakers of the device including the first speaker; and a central processor to:

determine, when the sensor has been triggered, whether the audio sample is distorted; and when the audio sample is distorted:

determine at least one alternative speaker from the multiple speakers; and increase an output from at least one of the speaker or the alternative speaker.

14. The device of claim 13, wherein the sensor comprises at least one of an infrared sensor, a thermocouple, a resistance thermometer, or a tactile sensor.

15. The device of claim 13, wherein the sensor comprises a sensor integrated into a casing of the device to detect at least one of physical pressure, a change in temperature, a change in resistance, a change in conductivity, or a change in shape of the casing of the device.

16. The device of claim 13, wherein the sensor comprises a miniature microphone adjacent to the speaker and the audio controller is to determine a second audio sample detected via the miniature microphone is distorted and to increase the output based on the distorted audio sample.

17. The device of claim 13, wherein the central processor to determine whether the audio sample is distorted comprises the central processor to compare a volume of the audio sample to an expected volume of the audio sample.

18. The device of claim 13, wherein the central processor is to to verify, prior to increasing an output from the alternative speaker, no obstruction is associated with the alternative speaker.

19. The device of claim 18, further comprising:

a gyroscope to determine an orientation of the device, wherein the central processor is to determine the alternative speaker based at least in part on the orientation of the device.

20. The device of claim 13, further comprising:

a display coupled to the central processor, wherein the central processor is to provide an indicator of the obstructed speaker to a user via the display.

21. At least one non-transitory machine readable medium comprising a plurality of instructions that, in response to being executed on a device, cause the device to perform audio balancing by:

providing audio from a first speaker of the device;

determining whether a sensor adjacent to the first speaker has been triggered;

when the sensor has been triggered:

detecting, via a microphone of the device separate from the sensor, an audio sample provided by multiple speakers of the device including the first speaker; and determining whether the audio sample is distorted; and when the audio sample is distorted:

determining at least one alternative speaker from the multiple speakers; and increasing an output from at least one of the first speaker or the alternative speaker.

22. The machine readable medium of claim 21, wherein determining whether the audio sample is distorted comprises comparing a volume of the audio sample to an expected volume of the audio sample.

23. The machine readable medium of claim 21, wherein, when the sensor is not triggered or the audio sample is not distorted, no change is made to the audio from the first speaker.

24. The machine readable medium of claim 21, the machine readable medium comprising further instructions that, in response to being executed on the device, cause the device to perform audio balancing by:

verifying, prior to increasing an output from the alternative speaker, no obstruction is associated with the alternative speaker.

25. The machine readable medium of claim 24, wherein the alternative speaker is proximate to the speaker and increasing the output from the alternative speaker is based on a comparison of a volume of the audio sample to an expected volume of the audio sample.

* * * * *